(12) United States Patent
Matsushima

(10) Patent No.: US 6,794,038 B2
(45) Date of Patent: Sep. 21, 2004

(54) LATENT HARDENER, MANUFACTURING METHOD FOR LATENT HARDENER, AND ADHESIVE

(75) Inventor: Takayuki Matsushima, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 10/309,637

(22) Filed: Dec. 4, 2002

(65) Prior Publication Data

US 2004/0109949 A1 Jun. 10, 2004

(51) Int. Cl.$^7$ ................................................ B33B 9/04
(52) U.S. Cl. .................. 428/407; 428/402; 428/403; 427/212; 427/384; 427/386
(58) Field of Search ................................. 428/402, 403, 428/407; 427/212, 384, 386, 458, 473, 474, 475; 525/56, 58; 528/361, 395, 416

(56) References Cited

U.S. PATENT DOCUMENTS

| | | | |
|---|---|---|---|
| 4,324,873 A | * | 4/1982 | Wada et al. ............... 525/507 |
| 4,923,945 A | | 5/1990 | Isozaki et al. |
| 5,026,793 A | | 6/1991 | Nakai et al. |
| 5,218,018 A | | 6/1993 | Tominaga et al. |
| 5,739,180 A | | 4/1998 | Taylor-Smith |
| 5,786,435 A | | 7/1998 | Marutani et al. |
| 5,821,314 A | | 10/1998 | Ikushima et al. |
| 5,855,821 A | | 1/1999 | Chau et al. |
| 5,929,140 A | | 7/1999 | Fujii et al. |
| 6,200,680 B1 | * | 3/2001 | Takeda et al. ............... 428/402 |
| 6,274,671 B1 | | 8/2001 | Kageishi et al. |
| 6,329,058 B1 | | 12/2001 | Arney et al. |
| 2002/0151627 A1 | | 10/2002 | Matsushima |
| 2003/0031786 A1 | | 2/2003 | Rumpler et al. |

OTHER PUBLICATIONS

Machine Translation, JP 09–241607, Ishikawa et al., Sep. 16, 1997, http://www19.ipdl.jpo.go.jp/PA1.htm, Japan Patent Office.*
Abstract, JP 2002–368047A, Matsushima, Dec. 20, 2002, JPO on East.*
88941—Filing Receipt, Specification and Drawings for related application Ser. No. 10/309,688 (commonly owned by assignee).
88942—Filing Receipt, Specification and Drawings for related application Ser. No. 10/310,517 (commonly owned by assignee).

* cited by examiner

Primary Examiner—David J. Buttner
Assistant Examiner—Christopher Keehan
(74) Attorney, Agent, or Firm—Welsh & Katz, Ltd.

(57) ABSTRACT

There is provided an adhesive which hardens under the condition of low temperature within short time and has a high preserving property. The latent hardener of the present invention has hardener particles mainly comprising metal chelate and capsules covering the surface of the hardener particles where, in the surface part of the hardener particles, substituent of the resin component constituting the capsule is bonded to the metal chelate. Accordingly, mechanical strength of the capsule is high whereby the capsule is not broken in a step of kneading the latent hardener with an epoxy resin.

10 Claims, 6 Drawing Sheets

Fig. 1
(A) 
(B) 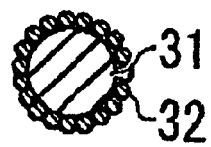
(C) 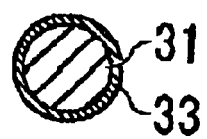
Fig. 2
(A) 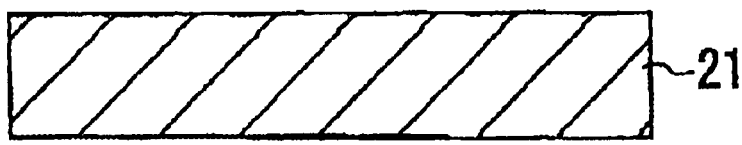
(B) 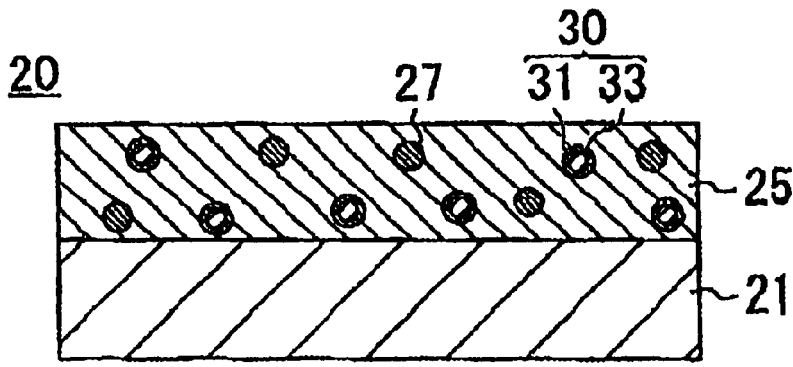

Fig. 4
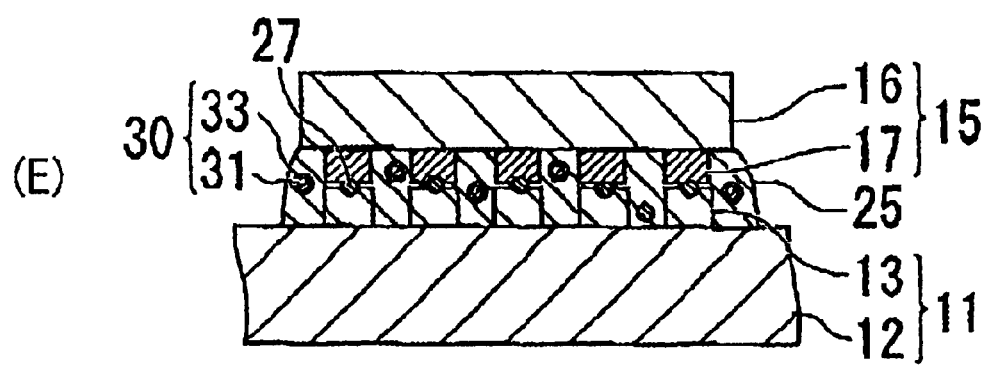
(E)
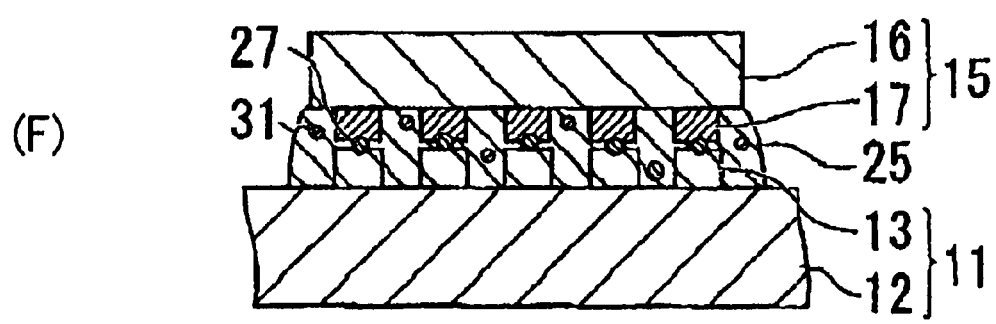
(F)

Fig. 7
(A) 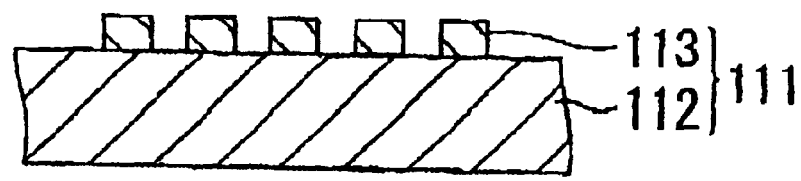
(B) 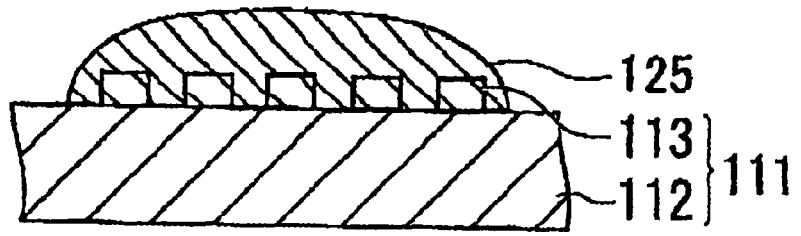
(C) 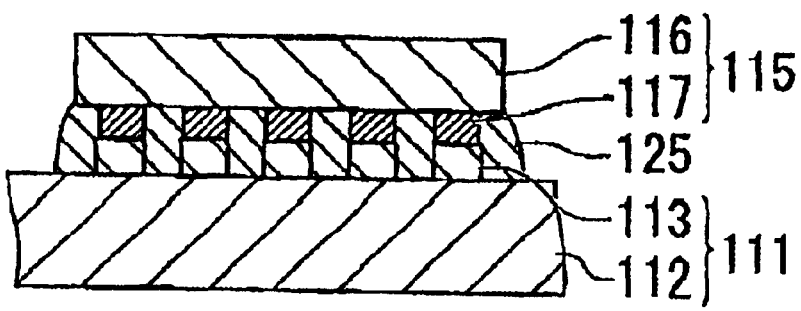

LATENT HARDENER, MANUFACTURING METHOD FOR LATENT HARDENER, AND ADHESIVE

BACKGROUND OF THE INVENTION

1. Field of the Invention

The present invention relates to an adhesive and, more particularly, to a latent hardener used for an adhesive by which semiconductor chip and TCP (tape carrier package) are connected to substrates by means of a thermal compression bonding.

2. Description of Related Art

Adhesives containing an epoxy resin as a thermosetting resin have been conventionally used in connecting semiconductor chips onto a substrate or in manufacturing of electric apparatuses by connecting TCP to LCD (liquid crystal display)

The reference numeral 111 in FIG. 7A shows an LCD, and the LCD 111 has a glass substrate 112 and ITO (indium tin oxide) electrodes 113 arranged on the glass substrate 112. In connecting the LCD 111 to a TCP which will be mentioned later, an adhesive is firstly applied on the surface of the side to which the ITO electrodes 113 of the LCD 111 are arranged. The reference numeral 125 in FIG. 7B shows an adhesive applied on the LCD 111.

The reference numeral 115 of FIG. 7C shows a TCP, and the TCP 115 has a base film 116 and metal wirings 117 arranged on the surface of the base film 116. The side on which the metal wirings 117 of the TCP 115 are arranged is disposed to an adhesive 125 on the LCD 111, and after being positioned, the side to which the metal wirings 117 of the TCP 115 are arranged is pushed to the adhesive 125.

When heated as pushed in such a state, the adhesive 125 softens, and the metal wirings 117 push away the softened adhesive 125, thereby attaching to the surface of the ITO electrodes 113.

A hardener such as imidazole polymerized of an epoxy resin by heating is generally added to the adhesives mentioned as above, and when heating is further continued in a state where the metal wirings 117 are attached to the ITO electrodes 113, the epoxy resin is polymerized by a catalytic reaction of the hardener to harden the adhesive 125.

The reference numeral 101 of FIG. 7C shows an electric apparatus in a state where the adhesive 125 is hardened. In the electric apparatus 101, the TCP 115 and the LCD 111 are fixed by the hardened adhesive 125 while the metal wirings 117 are attached to the electrodes 113. Accordingly, the TCP 115 and the LCD 111 are connected to each other electrically and mechanically.

However, when the above adhesive is hardened, it is necessary to heat the adhesive at the temperature of as high as not lower than 180° C. and, if the pattern of the metal wiring 117 is fine, there may be the case where deformation such as elongation or warp is resulted in the TCP 115 upon heating. Such a problem may be solved when heating temperature is lowered, but time required for the heating treatment becomes longer and productivity lowers.

With regard to adhesives having excellent hardening property at low temperature, some adhesives including radically polymerizable resins such as acrylate and a radical polymerization initiator have been developed in recent years, but such adhesives are inferior in electric characteristics and heat resistance in a hardened state to an adhesive using an epoxy resin.

The present invention has been created for solving the above-mentioned inconveniences in the prior art, and its object is to provide an adhesive able to be hardened under the condition of lower temperature and short time and also has excellent preserving property.

The inventor of the present invention paid his attention to a means where commonly used hardeners are not used but an epoxy resin is subjected to a cationic polymerization and carried out repeated investigations and, as a result, he has found a method where a silane compound having at least one alkoxy group in a structure (a silane coupling agent) and a metal chelate (or a metal alcoholate) are added to an adhesive and the epoxy resin is polymerized (cationically polymerized) by cation produced by the reaction of the metal chelate or the metal alcoholate with the silane coupling agent.

The step of hardening of the epoxy resin by an adhesive to which metal chelate and silane coupling agent are added will be illustrated by the following reaction formulae (1) to (4).

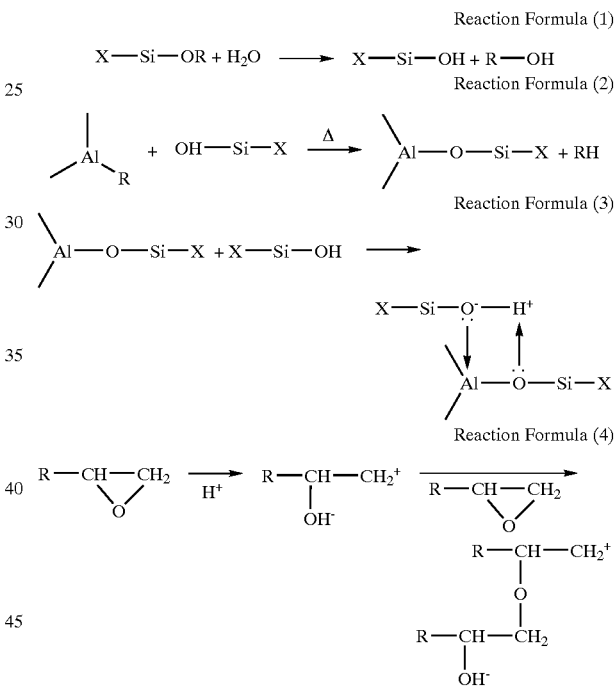

As shown in the reaction formula (1), a silane compound having at least one alkoxy group reacts with water in the adhesive whereupon the alkoxy group is hydrolyzed to give a silanol group.

When the adhesive is heated, the silanol group reacts with metal chelate such as aluminum chelate and the silane compound is bonded to the aluminum chelate (the reaction formula (2)).

After that, as shown in the reaction formula (3), another silanol remaining in the adhesive in an equilibrium reaction is arranged to the aluminum chelate to which the silanol is bonded whereupon Bronsted acid points are produced and, as the reaction formula (4) shows, an epoxy ring located at the end of the epoxy resin is opened by the activated proton and is polymerized with an epoxy ring of another epoxy resin (cationic polymerization). As such, when a silane coupling agent and a metal chelate are added to an adhesive, a thermosetting resin such as epoxy resin is cationically polymerized. Since the reactions as shown by the reaction formulae (2) to (4) proceed at lower temperature than the temperature (180° C. or more) at which the conventional adhesives are hardened, the adhesive as mentioned above hardens at lower temperature within shorter time than in the case of the conventional ones.

However, when metal chelate or metal alcoholate is directly dispersed in an adhesive with a silane coupling agent, polymerization reaction of an epoxy resin proceeds even at ambient temperature and, therefore, preserving property becomes poor. When metal chelate is sealed in a capsule to prepare the so-called latent hardener, preserving property of the adhesive is enhanced but, when the mechanical strength of the capsule is weak, the capsule may be broken during the step of dispersing the latent hardener in the epoxy resin.

When the present inventor has carried out further and intensive investigations for a method of enhancing the mechanical strength of capsules, it has been found that, where a capsule is constituted using a resin component having a substituent such as hydroxyl group and carboxyl group, metal chelate and the said substituent are connected on the surface part of the hardener particles whereupon the mechanical strength of the capsule becomes high, thereby producing a latent hardener strong against physical impacts.

SUMMARY OF THE INVENTION

The present invention has been constituted on the basis of the above-mentioned findings. A latent hardener according to the present invention includes a hardener particle mainly including either or both of metal chelate and metal alcoholate; and a capsule covering the surface of the hardener particle and including a resin component having a substituent of either hydroxyl group or carboxyl group or having substituents of hydroxyl group and carboxyl group. In the latent hardener according to this invention, the substituent or substituents of the resin component react with either or both of the metal chelate and the metal alcoholate on a surface of the hardener particle.

According to an embodiment of the invention, the metal chelate is made of aluminum chelate, where the metal alcoholate is made of aluminum alcoholate. The resin component is also mainly comprises including polyvinyl alcohol.

In another aspect of this invention, a manufacturing method for a latent hardener including a hardener particle and a capsule covering a surface of the hardener particle, includes the steps of: manufacturing a capsule material made of a resin component having a substituent of either hydroxyl group or carboxyl group or having substituents of hydroxyl group and carboxyl group and formed in a powder shape having a smaller average particle size than that of the hardener particle; and forming a capsule in adhering the capsule material on the surface of the hardener particle and melting the capsule material at a state that the capsule material is being adhered on the surface of the hardener particle.

According to a preferred embodiment of the invention, the step of the forming a capsule has a mixing step where the hardener particle and the capsule material are mixed so that the capsule material is adhered on the surface of the hardener particle and a stirring step where the hardener particle in a state of being adhered with the capsule material are stirred so that the capsule material is melted. The ratio of the average particle size of the hardener particle to the average particle size of the capsule material is 100:80 or more, and preferably, 100:50 or more. After the capsule is formed, the capsule and the hardener particle are heated.

In another aspect of the invention, an adhesive includes a thermosetting resin, a silane coupling agent and a latent hardener as mentioned above.

BRIEF DESCRIPTION OF THE DRAWINGS

FIGS. 1A to 1C are illustrations showing an example of the manufacture of a latent hardener of the present invention.

FIGS. 2A and 2B are illustrations showing an example of a step for the manufacture of an adhered film using the adhesive of the present invention.

FIGS. 4E and 4F are illustrations showing the second half of the step for connecting the LCD to the TCP.

FIGS. 7A to 7C are illustrations showing the first half of a step for connecting an LCD to a TCP using the adhesive of the prior art.

DETAILED DESCRIPTION OF THE PREFERRED EMBODIMENTS

Figure 3:
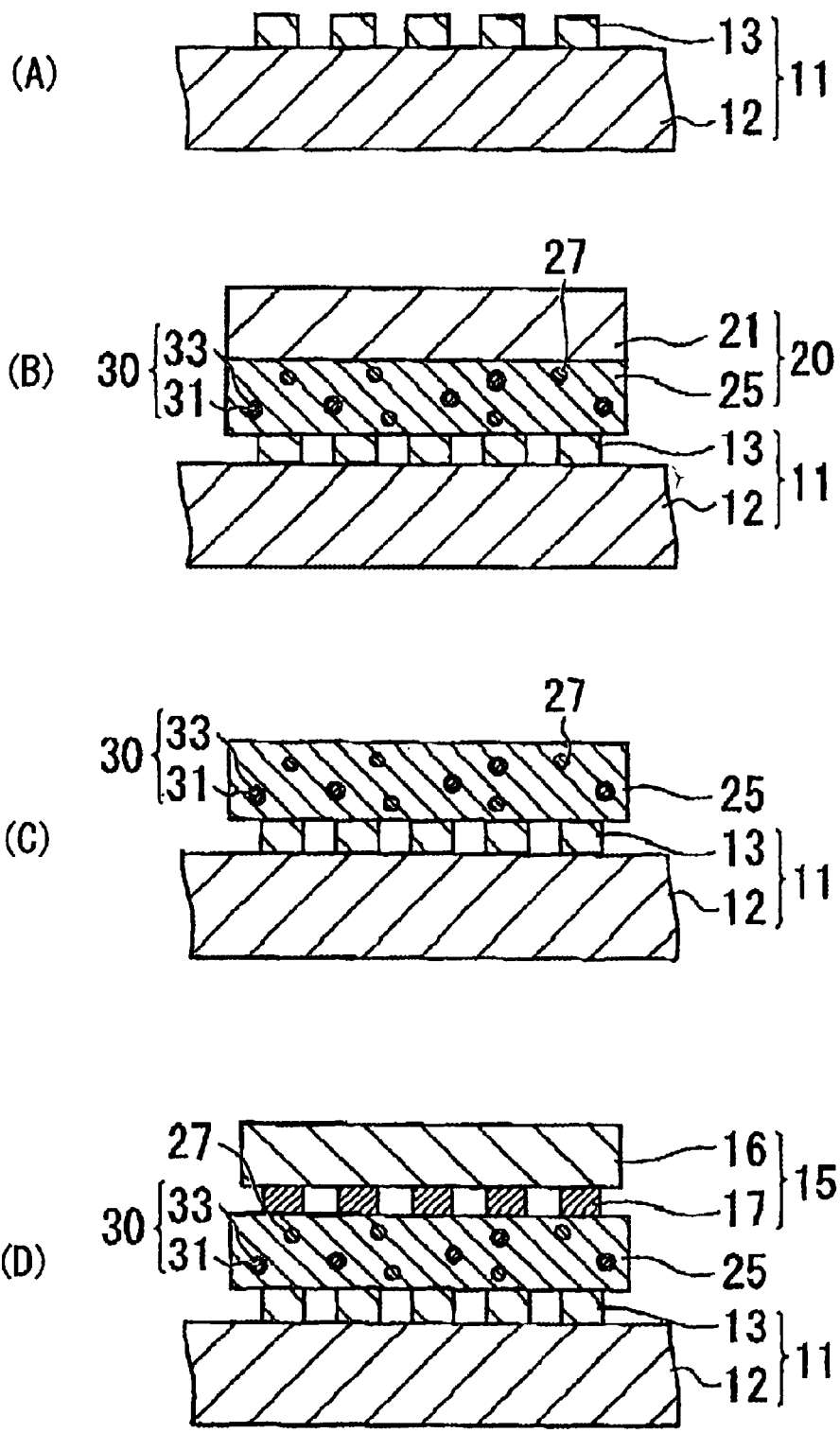
FIGS. 3A to 3D are illustrations showing the first half of the step for connecting an LCD to a TCP using the adhesive of the present invention.

The present invention is constituted as mentioned above and, when powdery capsule material and hardener particles are mixed and stirred, the capsule material is electrostatically adhered on the surface of the hardener particles. When the hardener particles in this state are stirred at high speed, fusion takes place where the capsule material is electrostatically adhered on the surface of the hardener particles and the capsule material is united to give a capsule (capsulation).

When the reactivity of the substituent of the resin component with the hardener particles is particularly high, the substituent of the resin component reacts with metal chelate or metal alcoholate on the surface of the hardener particles during the capsulation step, and the substituent is connected to the central atom of the metal chelate or the metal alcoholate.

When the reactivity of the substituent of the resin component to the hardener particles is low, the capsule is heated with the hardener particles after the capsulation step whereupon the reaction of the substituent with the metal chelate or the metal alcoholate on the surface of the hardener particles is able to proceed.

The following reaction formula (5) shows the reaction where the substituent of the resin component is bonded to aluminum chelate when aluminum chelate is used as the metal chelate.

Reaction Formula (5)

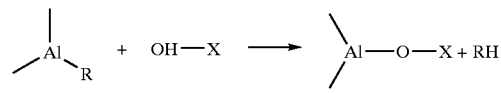

The above reaction formula (5) shows the case where aluminum chelate and hydroxyl group are bonded and a proton (hydrogen atom) is detached from hydroxyl group and bonded to aluminum. When the substituent is carboxyl group, hydroxyl group in the carboxyl group is bonded to aluminum according to the same reaction as in the above reaction formula (5).

As such, in the latent hardener of the present invention, a substituent of the resin composition constituting the capsule is connected to metal chelate on the surface of the hardener particles and, therefore, mechanical strength of the capsule becomes high. Accordingly, during the step for the manufacture of an adhesive in which the latent hardener of the present invention is dispersed in epoxy resin, no capsule is damaged by physical impacts.

When an adhesive is prepared by mixing the latent hardener with a silane coupling agent and epoxy resin, all of the surfaces of the powdery hardener are covered with capsules at ambient temperature and, therefore, no polymerization reaction of the epoxy resin takes place while, when the adhesive is heated, the metal chelate constituting the hardener particles is expanded by heat whereupon the capsule is broken.

When the capsule is broken, the hardener particles are mixed with an epoxy resin and a silane coupling agent in the adhesive whereupon a metal chelate constituting the hardener particles reacts with the silane coupling agent resulting in a release of cation into the adhesive, polymerization of the epoxy resin rapidly proceeds by cation (cationic polymerization) and, as a result, the adhesive hardens.

When an average particle size of the hardener particles is too small, its difference in the particle size from the capsule material becomes small and formation of capsule becomes difficult and, therefore, it is preferred that an average particle size of the hardener particles is from 0.5 $\mu$m to 50 $\mu$m.

Incidentally, in a mixing step and a stirring step, a mixing apparatus where hardener particles and capsule material are mixed, and a hybridizer apparatus (such as "NHS-0" (trade name) manufactured by Nara Kikai Seisakusho K. K which stirs the hardener particles in a state of being adhered with the capsule material may be used. In that case, compounding ratio of the hardener particles to the capsule material can be calculated by the following formula (1).

$$M/m = D \times F / (4 \times d \times f) \quad (1)$$

In the above formula (1), M is a compounding amount (g) of the hardener particles; m is a compounding amount (g) of the capsule material; D is an average particle size ($\mu$m) of the hardener particles; d is an average particle size ($\mu$m) of the capsule material; F is specific gravity of the hardener particles; and f is specific gravity of the capsule material. Incidentally, specific gravity means the ratio of density of each substance to density of water at 4° C. which is a standard substance. However, the above formula (1) is a theoretical formula and the optimum compounding ratio of the hardener particles to the capsule material can be determined depending upon the circumstance.

When a thermoplastic resin is added to an adhesive, cohesive force of the adhesive increases due to the property of the thermoplastic resin whereby the adhesive property of the adhesive is further enhanced. When a substance having a high polarity is used as a thermoplastic resin, there is observed not only that the thermoplastic resin is incorporated into the hardening reaction of the epoxy resin but also that it is bonded to an inorganic material via a silane coupling agent. Accordingly, the outcome is not only that hardening property of the adhesive becomes high but also that its affinity to a thing to be adhered comprising an inorganic material becomes higher.

As hereunder, a step for the manufacture of the latent hardener of the present invention will be illustrated.

Firstly, there is prepared a resin component having one of the substituents or both comprising hydroxyl and carboxyl groups, the resin component is dispersed in a solvent to prepare a resin solution and the resin solution is spray-dried using a spray-drying apparatus to give a powdery resin component (capsule material) (a spray-drying method).

Then, powder of aluminum chelate as a metal chelate is prepared as hardener particles. The reference numeral 31 of FIG. 1A shows the hardener particles and the ratio of the average particle size of the hardener particles to the average particle size of the capsule material is made 100:80 or more.

After that, the hardener particles 31 and the capsule material are mixed in a predetermined compounding ratio and stirred in a mixing apparatus whereupon a capsule material having smaller average particle size than hardener particle 31 is electrostatically adhered to the surface of the hardener particle 31 (mixing step).

The reference numeral 32 of FIG. 1B shows the capsule in such a state and the surface of one hardener particle 31 is covered with many capsule materials 32.

When hardener particles 31 where capsule material 32 is electrostatically adhered on the surface are poured into a stirring apparatus and stirred at high speed, the capsule material 32 on the surface of the hardener particles 31 collides with the capsule material 32 on the surface of other hardener particles 31 or with rotating blades or inner walls of the stirring apparatus or rubbed against them, the capsule material 32 is melted by heat generated thereby and the melted materials 32 are unified each other (stirring step).

At that time, the melted capsule material 32 contacts to the surface of the hardener particles 31, and the substituent of the resin component constituting the capsule material 32 is bonded to metal chelate on the surface part of the hardener particles 31.

The reference numeral 33 of FIG. 1C shows a capsule formed by unification of the capsule material 32. The capsule 33 is formed so as to cover the whole surface of the hardener particle 31, and a latent hardener 30 is constituted from hardener particle 31 and capsule 33.

Reaction of the substituent of the resin component of the capsule material 32 with the metal chelate proceeds over time by its contact to metal chelate and, when the latent hardener 30 in a state where the capsule 33 is formed is heated, the substituent reacts with the metal chelate more quickly.

Now, the adhesive of the present invention using the latent hardener 30 and a step for the manufacture of an electric apparatus using the adhesive of the present invention will be illustrated.

An epoxy resin as a thermosetting resin, a thermoplastic resin, a silane coupling agent, the latent hardener 30, electrically conductive particles, and a solvent were mixed and stirred in a predetermined compounding ratio to prepare an adhesive. In such a state, the adhesive is pasty. Since mechanical strength of the capsule 33 of the latent hardener 30 is high, the capsule 33 is not broken during the stirring step.

The reference numeral 21 in FIG. 2A shows a releasing film. When the adhesive in a predetermined amount is applied on the surface of the releasing film 21 and dried, solvent in the adhesive is evaporated whereupon a coated layer 25 of the adhesive is formed (FIG. 2B)

The reference numeral 20 in FIG. 2B shows an adhesive film in a state where the coated layer 25 is formed. The reference numeral 27 in FIG. 2B shows electroconductive particles dispersed in the adhesive together with the latent hardener 30. In this state, the hardener particle 31 of the latent hardener 30 is sealed in the capsule 33, and a silane coupling agent in the adhesive constituting the coated layer 25 does not contact to the hardener particles 31. Therefore, no hardening reaction of the coated layer 25 takes place at ambient temperature.

The reference numeral 11 in FIG. 3A shows LCD and the LCD 11 has a glass substrate 11 and a plurality of ITO electrodes 13 (indium tin oxide) formed on one side of the glass substrate 12. In this drawing, five ITO electrodes 13 are shown.

The coated layer 25 of an adhesive film 20 shown in FIG. 2B is pushed and attached to the part of the surface whereto TCP which will be mentioned later among the surfaces where ITO electrodes 13 of LCD 11 are formed (FIG. 3B). Adhesive force of a releasing film 21 to the coated layer 25 is made smaller than that of a coated layer 25 to ITO electrodes 13 and, therefore, the coated layer 25 remains on the LCD 11 when the releasing film 21 is released (FIG. 3C).

Figure 5:
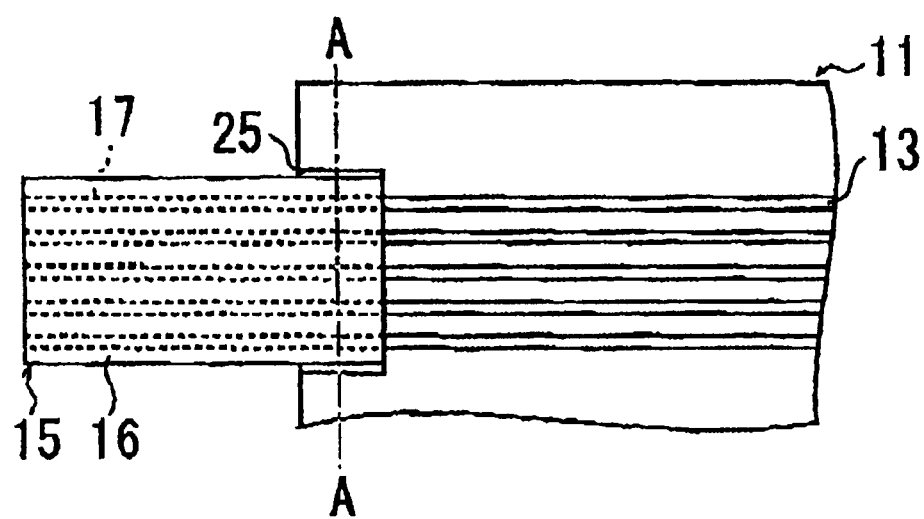
FIG. 5 is a plane figure which illustrates the state of positioning of the TCP on the LCD.

The reference numeral 15 in FIG. 5 shows TCP. The TCP 15 has a long-sized base film 16 and, on one side of the base film 16, there are arranged a plurality of narrow metal wirings 17 in the longitudinal direction of the base film 16 (here, five metal wirings 17 are shown). Each end of the longitudinal direction of the metal wirings 17 is positioned at each end of the longitudinal end of the base film.

FIG. 3D shows a cross-sectional view of FIG. 5 along the line A—A in which a surface of the side to which the metal wirings 17 of TCP 15 are arranged is faced to the side to which the ITO electrodes 13 of LCD 11 are arranged while an end of the TCP 15 is faced to the coated layer 25 of the surface of the ITO electrode 13 whereby there is positioned in such a manner that the ITO electrode 13 of the LCD 11 and the metal wiring 17 of the TCP 15 face each other.

When the surface to which the metal wirings 17 of the TCP 15 are arranged is pushed and attached to the coated layer 25 in such a state and the whole is heated together with pressing the part where TCP 15 and LCD 11 are layered, the coated layer 25 softens by heating, the metal wirings 17 push away the softened coated layer 25 by means of the pressure and the electrically conductive particles 27 in the remained coated layer 25 are sandwiched between the metal wirings 17 and the ITO electrodes 13 (FIG. 4E).

When heating with pressure is continued under such a state, the hardener particles 31 are expanded by heat and the capsules 33 are broken. When the capsules 33 are broken and the hardener particles 31 are mixed with an epoxy resin and a silane coupling agent in the coated layer 25, an aluminum chelate constituting the hardener particles 31 reacts with the silane coupling agent and cation is released into the coated layer 25. Polymerization of the epoxy resin rapidly proceeds by the cation (cationic polymerization) and the coated layer 25 hardens in such a state that the metal wirings 17 and the ITO electrodes 13 sandwich the electrically conductive particles 27 (FIG. 4F).

The reference numeral 10 in FIG. 4F shows an electric apparatus in a state where the coated layer 25 is hardened. In the electric apparatus 10, it is not only that the metal wirings 17 and the ITO electrodes 13 are electrically connected via electrically conductive particles 27 but also that the LCD 11 and the TCP 15 are mechanically (or physically) connected by the hardened coated layer 25.

As such, in the adhesive of the present invention, it is not only that preserving property is excellent but also an epoxy resin is hardened by cationic polymerization, and accordingly, the adhesive is able to be hardened at lower temperature within a shorter time as compared with the case where a conventional hardener is used.

EXAMPLES

A resin composition (10 parts by weight) (comprising "PVA 205" (trade name) manufactured by Kuraray) was dissolved in 90 parts by weight of water to prepare a 10% by weight aqueous solution of the resin component. After that, the 10% by weight aqueous solution of the resin component was dried by spraying into nitrogen gas (temperature: 160° C.) to prepare a powdery capsule material 32 (average particle size: 0.8 μm) (spray-drier method).

There were prepared ground fine powder of aluminum chelate which is a metal chelate (aluminum acetylactonate manufactured by Kawaken Fine Chemical) and ground fine powder of aluminum alcoholate which is a metal alcoholate (aluminum isopropylate manufactured by Kawaken Fine Chemical) as hardener particles 31. Average particle size of each of the two kinds of hardener particles 31 was 5 μm. Accordingly, the ratio of the average particle size of the hardener particles 31 to that of the capsule material 32 is 5:0.8.

After that, the capsule material 32 was electrostatically adhered on the surface of the hardener particles 31 in the above steps of FIGS. 1A and B followed by stirring under the operation condition of revolution of 16,200 rpm (circumferential speed: 100 m/second) and treating time of 5 minutes using "Hybridizer NHS-0" (trade name) manufactured by Nara Kikai Seisakusho K. K to prepare capsules 33 whereupon two kinds of latent hardeners 30 were obtained. Then those latent hardeners 30 were heated at the condition of 40° C. and 48 hours.

Those two kinds of latent hardeners 30, a phenoxy resin ("PKHH" (trade name) manufactured by Phenoxy Associates K. K which is a thermoplastic resin, an bisphenol A type epoxy resin ("EP 828" (trade name) manufactured by Yuka Shell Epoxy K. K which is a thermosetting resin, a silane coupling agent ("A-187" (trade name) manufactured by Nippon Unicar) and electrically conductive particles were compounded in the compounding ratio as shown in the following Table 1 to prepare two kinds of pasty adhesives and, using those adhesives, adhesive films 20 of Examples 1 and 2 were prepared according to the steps of FIGS. 2A and B.

TABLE 1

(Compositions of Adhesives)

| Compositions of Adhesives | Example 1 | Example 2 | Comp. Ex. 1 | Comp. Ex. 2 |
|---|---|---|---|---|
| Phenoxy resin | 50 | 50 | 50 | 50 |
| Bisphenol A type Epoxy resin | 50 | 50 | 50 | 50 |
| Latent hardener A | 1 | — | — | — |
| Latent hardener B | — | 1 | — | — |
| Aluminum trisacetacetate | — | — | 1 | — |
| Aluminum isopropylate | — | — | — | 1 |
| Silane coupling agent | 1 | 1 | 1 | 1 |
| Electrically conductive particles | 5 | 5 | 5 | 5 |

Latent adhesive A: (aluminum trisacetacetate) and (capsule)
Latent adhesive B: (aluminum isopropylate) and (capsule)
Each numeral in the above table is in part(s) by weight.

Comparative Examples 1 and 2 in the above Table 1 are the cases where the two kinds of hardener particles used in Examples 1 and 2 were added to the adhesive without formation of capsules.

Each of the adhesive films 20 of Examples 1 and 2 and Comparative Examples 1 and 2 was used for each of the following "test upon preservation at room temperature" and "test upon preservation at 40° C.".

[Test Upon Preservation at Room Temperature]

After the TCP 15 and the LCD 11 were connected according to the steps of FIGS. 3A to 3D and FIGS. 4E to 4F using the adhesive films 20 of Examples 1 and 2 and Comparative Examples 1 and 2, strength for releasing the TCP 15 from the LCD 11 was measured (initial releasing force).

Apart from that, the adhesive films 20 of Examples 1 and 2 and Comparative Examples 1 and 2 were preserved at room temperature (25° C.) for 1 day, 3 days and 7 days, TCP 15 and LCD 11 were connected by the same step using each of the adhesives films 20 after preservation and strength for releasing the TCP 15 from the LCD 11 was measured (releasing force after preservation).

[Test Upon Preservation at 40° C.]

The adhesive film 20 was preserved under the same condition as the above "test upon preservation at room temperature" except that the temperature for preserving the adhesive film was changed from room temperature to 40° C. to connect the TCP 15 to the LCD 11 and then the strength for releasing after the preservation was measured.

In the above "test upon preservation at room temperature" and "test upon preservation at 40° C.", the case where the degree of the releasing force after the preservation was 90% or more of the initial releasing force was evaluated as "excellent", the case where that was from 80% or more but less than 90% was evaluated as "good", where that was from 70% or more but less than 80% was evaluated as "fair" and the case where that was less than 70% was evaluated as "poor" and the result of the evaluation is mentioned in the following Table 2.

without being sealed into the capsules, the result of the evaluation was bad in all cases as compared with the cases of Examples 1 and 2. Especially in the case of Comparative Example 2 where a highly reactive aluminum alcoholate (aluminum isopropylate) was used, polymerization reaction of epoxy resin proceeds in a step for the manufacture of an adhesive and an adhesive film whereupon viscosity of the adhesive became too high and, therefore, it was not possible to prepare an adhesive film per se.

As hereinabove, although there were illustrated the cases where an adhesive film was prepared using an adhesive, the present invention is not limited thereto but, for example, an adhesive may be used also in its original pasty form.

Figure 6:
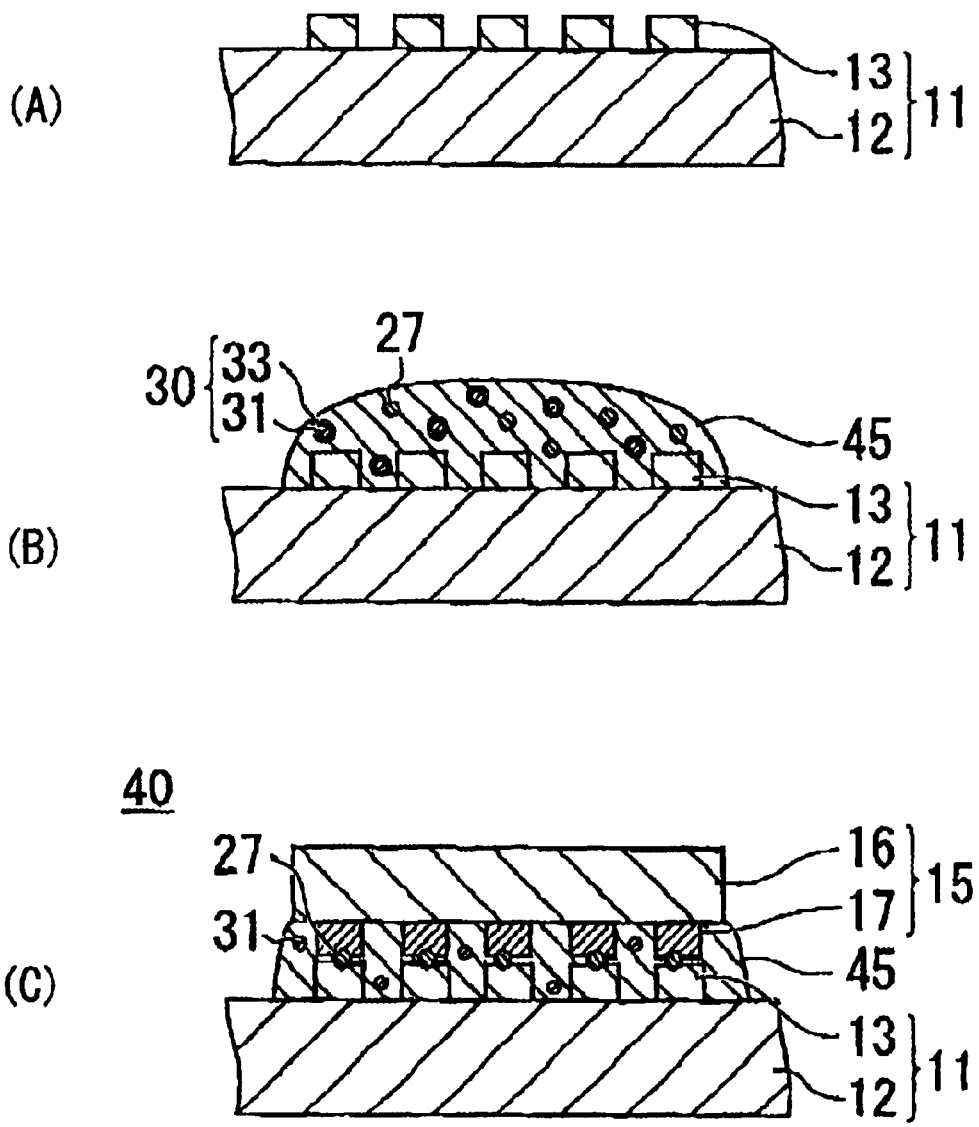
FIGS. 6A to 6C are illustratons showing another example of a step for connecting a TCP to an LCD using the adhesive of the present invention.

The reference numeral 11 in FIG. 6A shows the same LCD as that shown in FIG. 3A and, in connecting the TCP 15 to this LCD 11, an adhesive was first applied to the part to which the TCP 15 is connected among the surface of the ITO electrode 13 of the LCD 11 whereupon a coated layer 45 of an adhesive is formed (FIG. 6B).

After that, positioning of the TCP 15 was carried out in the step of FIG. 3D and then the TCP 15 and the LCD 11 were connected in the steps of FIG. 4E and F whereupon an electric apparatus 40 was prepared (FIG. 6C).

As hereinabove, although there were illustrated the cases where the TCP 15 and the LCD 11 were connected using an adhesive, the present invention is not limited thereto but may also be used for the cases where various electric apparatuses are used such as a case where a substrate and a semiconductor chip are connected.

With regard to electrically conductive particles 27 used for the adhesive of the present invention, various ones may be used. In addition, although there were hereinabove illustrated the cases where electrically conductive particles are dispersed in an adhesive, the present invention is not limited thereto but, for example, an adhesive containing no electrically conductive particle is covered by the present invention.

TABLE 2

(Result of Evaluation Test)

| | Preserved at room temperature for | | | Preserved at 40° C. for | | |
|---|---|---|---|---|---|---|
| | 1 day | 3 days | 7 days | 1 day | 3 days | 7 days |
| Example 1 | excellent | excellent | excellent | excellent | excellent | excellent |
| Example 1 | excellent | excellent | excellent | excellent | excellent | good |
| Comp. Ex. 1 | good | fair | poor | poor | poor | poor |
| Comp. Ex. 2 | — | — | — | — | — | — |

—: The adhesive hardened during the manufacturing steps of the adhesive film

Here, with regard to the TCP 15, used was that metal wirings 17 each having a width of 25 μm. With an interval of 25 μm was used while, with regard to the LCD 11, used was that ITO electrode 13 having a sheet resistance was 10 ohms per cm² of the surface area. They were heated for 10 seconds together with application of a load of 3 MPa to the part where TCP 15 and LCD 11 were overlapped so that the coated layer 25 was heated up to 130° C. to connect.

As will be apparent from the above Tables 1 and 2, the result of the evaluation was good both in "test upon preservation at room temperature" and "test upon preservation at 40° C." in Examples 1 and 2 where the hardener particle 31 was sealed in the capsule 33 and it was confirmed that the adhesive using the latent adhesive of the present invention had excellent preserving property.

On the other hand, in Comparative Examples 1 and 2 where the hardener particles were added to the adhesive With regard to a metal chelate, various metal chelates such as zirconium chelate, titanium chelate and aluminum chelate may be used and, among them, a highly reactive aluminum chelate may be more preferably used.

Although there were illustrated the cases where polyvinyl alcohol was used as a resin component hereinabove, the present invention is not limited thereto. It is also possible to use various ones so far as they have substituents such as hydroxyl group and carboxyl group which are reactive to a metal chelate and a metal alcoholate. For example, there maybe used various resins such as phenoxy resin, urethane resin and polyester resin.

Heating temperature for heating the latent hardener 30 after formation of capsules 33 is not also limited to 40° C. However, when the heating temperature is too high, the capsules 33 are broken and, therefore, it is preferred that the heating temperature is not higher than the glass transition temperature of the resin component.

With regard to a thermosetting resin, various ones such as urea resin, melamine resin, phenol resin, vinyl ether resin and oxetane resin may be used in addition to epoxy resin and, when strength of the adhesive after thermosetting, etc. are taken into consideration, the use of epoxy resin is preferred.

With regard to a silane coupling agent used in the present invention, it is preferred to use that which is shown by the following formula (6).

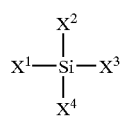

Formula (6)

(In the above formula (6), at least one of the substituents $X^1$–$X^4$ is an alkoxy group. The alkoxy group is preferably methoxy group or ethoxy group. Among the substituents $X^1$–$X^4$ besides an alkoxy group, at least one is preferably that which has epoxy ring or vinyl group and, particularly preferably, a substituent having an epoxy ring is glycidyl group. An example of a substituent having vinyl group is methacryloxypropyl group. An example of a substituent having glycidyl group is glycidoxypropyl group. The so-called silicate where all of the substituents $X^1$–$X^4$ are alkoxy group may be used as well.) With regard to a thermoplastic resin, various ones other than phenoxy resin such as polyester resin, polyurethane resin, polyvinyl acetal, ethylene vinyl acetate and rubbers (e.g., polybutadiene rubber) may be used as well.

Advantages of the present invention are that, in the adhesive of the present invention, it is not only that preserving property of an adhesive is enhanced but also that, at the surface part of hardener particles, substituent of the resin component constituting the capsule is bonded to metal chelate which is a main component of the hardener particles. Accordingly, mechanical strength of capsules is high and a latent hardener has a high resistance to physical impacts.

What is claimed is:

1. A latent hardener comprising:
   a hardener particle mainly including either or both of metal chelate and metal alcoholate; and
   a capsule covering the surface of the hardener particle said capsule including a resin component having a substituent of either hydroxyl group or carboxyl group or having substituents of hydroxyl group and carboxyl group and;
   wherein the substituent or substituents of the resin component couple with either or both of the metal chelate and the metal alcoholate on a surface of the hardener particle.

2. The latent hardener according to claim 1, wherein the metal chelate mainly comprises aluminum chelate.

3. The latent hardener according to claim 1, wherein the metal alcoholate mainly comprises aluminum alcoholate.

4. The latent hardener according to claim 1, wherein the resin component mainly comprises polyvinyl alcohol.

5. A method for preparing a latent hardener including a hardener particle and a capsule covering a surface of the hardener particle, comprising the steps of:
   preparing a capsule material made of a resin component having a substituent of either hydroxyl group or carboxyl group or having substituents of hydroxyl group and carboxyl group and formed in a powder having a smaller average particle size than that of the hardener particle; and
   forming a capsule by adhering the capsule material on the surface of the hardener particle melting the capsule material that the capsule material adheres to encapsulate the hardener particle.

6. The method for preparing latent hardener according to claim 5, wherein the step of the forming a capsule has a mixing step where the hardener particle and the capsule material are mixed so that the capsule material is adhered on the surface of the hardener particle and a stirring step where the hardener particles in a state of being adhered with the capsule material are stirred so that the capsule material is melted.

7. The method for preparing a latent hardener according to any of claim 5 and claim 6, wherein the ratio of the average particle size of the hardener particle to the average particle size of the capsule material is 100:80 or more.

8. The method for preparing a latent hardener according to any of claim 5 and claim 6, wherein the ratio of the average particle size of the hardener particle to the average particle size of the capsule material is 100:50 or more.

9. The method for preparing latent hardener according to claim 5, wherein, after the capsule is formed, the capsule and the hardener particle are heated.

10. An adhesive having a thermosetting resin, a silane coupling agent and a latent hardener mentioned in any of claim 1 to claim 4.

* * * * *